US009070768B2

(12) United States Patent
Lerner et al.

(10) Patent No.: US 9,070,768 B2
(45) Date of Patent: Jun. 30, 2015

(54) DMOS TRANSISTOR HAVING AN INCREASED BREAKDOWN VOLTAGE AND METHOD FOR PRODUCTION

(75) Inventors: Ralf Lerner, Erfurt (DE); Phil Hower, Dallas, TX (US); Gabriel Kittler, Ilmenau (DE); Klaus Schottmann, Drei Gleichen (DE)

(73) Assignees: X-FAB Semiconductor Foundries AG (DE); Texas Instruments Inc, Dallas, TX (US)

( * ) Notice: Subject to any disclaimer, the term of this patent is extended or adjusted under 35 U.S.C. 154(b) by 0 days.

(21) Appl. No.: 13/579,155

(22) PCT Filed: Feb. 15, 2010

(86) PCT No.: PCT/IB2010/050676
§ 371 (c)(1),
(2), (4) Date: Aug. 15, 2012

(87) PCT Pub. No.: WO2011/098866
PCT Pub. Date: Aug. 18, 2011

(65) Prior Publication Data
US 2012/0306010 A1    Dec. 6, 2012

(51) Int. Cl.
*H01L 29/66* (2006.01)
*H01L 21/336* (2006.01)
*H01L 29/78* (2006.01)
*H01L 29/06* (2006.01)
*H01L 29/423* (2006.01)

(52) U.S. Cl.
CPC ........ *H01L 29/7828* (2013.01); *H01L 29/0623* (2013.01); *H01L 29/42376* (2013.01); *H01L 29/4238* (2013.01); *H01L 29/66666* (2013.01)

(58) Field of Classification Search
CPC ............... H01L 29/42376; H01L 29/66712; H01L 29/802; H01L 29/4238; H01L 29/0696; H01L 29/0878; H01L 29/1045; H01L 29/1095; H01L 29/04; H01L 21/266; H01L 21/02336; H01L 29/336; H01L 29/78
USPC ............ 257/329, 263, 302, 328, 335, E21.41, 257/E21.346, E21.418, E21.417, E29.066, 257/E29.257, E29.256, E29.262, E29.266; 438/289, 262, 268, 212, 224, 228, 273, 438/306, 526, 527, 138
See application file for complete search history.

(56) References Cited

U.S. PATENT DOCUMENTS 4,003,071 A    1/1977 Takagi
5,623,151 A *  4/1997 Ajit ............................ 257/212
(Continued)

OTHER PUBLICATIONS

Young, Lee W.; International Search Report; International Application No. PCT/IB2010/050676; Jul. 13, 2010; ISA/US; Commissioner for Patents; Alexandria, VA.

(Continued)

*Primary Examiner* — Chuong A Luu
*Assistant Examiner* — Moazzam Hossain
(74) *Attorney, Agent, or Firm* — Stevens & Showalter LLP

(57) ABSTRACT

A depletion type DMOS transistor comprises a gap in electrode material allowing incorporation of a well dopant species into the underlying semiconductor material. During subsequent dopant diffusion a continuous well region is obtained having an extended lateral extension without having an increased depth. The source dopant species is implanted after masking the gap. Additional channel implantation is performed prior to forming the gate dielectric material.

15 Claims, 8 Drawing Sheets

(56) References Cited

U.S. PATENT DOCUMENTS

| | | | |
|---|---|---|---|
| 6,700,160 | B1 | 3/2004 | Merchant |
| 7,037,795 | B1 | 5/2006 | Barr et al. |
| 8,133,788 | B2* | 3/2012 | Sayama et al. ............... 438/283 |
| 2003/0151093 | A1* | 8/2003 | Rumennik et al. ............ 257/343 |
| 2006/0249785 | A1* | 11/2006 | Bhalla et al. ................. 257/328 |
| 2006/0292771 | A1 | 12/2006 | Merchant et al. |
| 2009/0181503 | A1* | 7/2009 | Bhalla et al. ................. 438/186 |
| 2009/0244928 | A1* | 10/2009 | Yang et al. ..................... 363/16 |
| 2010/0025765 | A1* | 2/2010 | Yang et al. ................... 257/343 |
| 2011/0169078 | A1* | 7/2011 | Yang et al. ................... 257/336 |
| 2012/0175679 | A1* | 7/2012 | Marino et al. ................ 257/194 |

OTHER PUBLICATIONS

Parker, Kenneth; International Preliminary Report on Patentability; International Application No. PCT/IB2010/050676; Mar. 23, 2012; IPEA/US; Commissioner for Patents; Alexandria, VA.

John F. Wager et al.; Transparent Electronics; 5.4 Transparent thin-film transistors (TTFTs); p. 137; 2007.

Janelle Leger et al.; Iontronics: Ionic Carriers in Organic Electronic Materials and Devices; p. 212; 2010.

* cited by examiner

DMOS TRANSISTOR HAVING AN INCREASED BREAKDOWN VOLTAGE AND METHOD FOR PRODUCTION

TECHNICAL FIELD

The invention as claimed relates to a DMOS (double-diffused metal oxide semiconductor) transistor as depletion type, or configured to be operated in the depletion mode, in which a conductive channel is formed without applying a voltage to the gate electrode structure.

BACKGROUND

Generally field effect transistors (FET), specifically MOS transistors are semiconductor devices that comprise a source terminal and a drain terminal and an intermediate channel region, in which a conductive channel forms upon applying an appropriate control voltage to a gate electrode structure. The gate electrode structure in turn includes a gate electrode and a gate dielectric layer that separates the gate electrode from the channel region. By applying a voltage across the gate electrode and the semiconductor body that is connected to the channel region, exceeding the threshold voltage of the transistors charge carriers increasingly accumulate at the interface formed by the gate dielectric layer and the channel region and thus build up a conductive channel between the source region and the drain region. Hence, the current flow is established by one type of charge carriers only, contrary to the current flow in a bipolar transistor, where both, minority and majority charge carriers, contribute to current flow. Due to this unipolar current flow in field effect transistors, switching speed is significantly faster as compared to bipolar transistors, thereby making the FET, specifically MOS transistor a viable candidate for high-performance applications.

Recently FETs, specifically MOS transistors are increasingly used in power applications. Such applications require the handling of currents up to several tens Ampere or higher and voltages of up to 100 Volt and significantly higher, since in many cases fast switching transistors are also required in switched power supplies, motor controllers, and the like. The high voltages in power applications, however, necessitate specific adaptations in the dopant profiles of the MOS transistors so as to provide for the desired breakdown voltage characteristics. For instance, a so-called drift region is connected to the drain region and thus connects the drain region to the channel region provided. The drift region is basically a semiconductor region having the same basic doping as the drain region, however, at a reduced dopant concentration. This results in a substantially ohmic behaviour of the drift region, thereby generating a corresponding voltage drop across the drift region upon forming a conductive channel. Consequently, the dopant profile in the drain and source regions and their connection to the channel region with an intermediate drift region substantially determine the transistor characteristics in "power applications".

Field effect transistors may generally be divided into enhancement type transistors and depletion type transistors. While in an enhancement type transistor the channel region does not provide a conductive path when applying zero voltage at the gate electrode structure, depletion type transistors provide a conductive channel at zero gate voltage. Hence, the depletion type transistors are conductive without applying a gate voltage and these depletion transistors can be switched off by applying a gate voltage. For an n-channel transistor this voltage is negative. To this end the depletion type transistor receives an additional doping concentration in the channel region which results in a conductive path between the drain and source regions, which may increasingly be "depleted" of charge carriers upon applying a negative gate-to-source-voltage, thereby finally switching the transistor off when the channel region is fully depleted.

With reference to FIG. 1 a typical transistor configuration of a vertical DMOS transistor 10 and conventional techniques for forming an additional channel region for a depletion mode transistor will be explained in more detail.

Schematically illustrated is a cross-sectional view of said DMOS transistor 10 that is shown in the form of an enhancement type transistor. The transistor 10 comprises a highly doped substrate material 1, which also acts as the drain region or drain terminal of the transistor 10. For an n type transistor example, the drain region 1 is highly n doped. A semiconductor layer 2 is provided as drift region of the transistor 10 and formed above the drain region 1. The drift region has the same conductivity type as the drain region 1, however with a reduced dopant concentration. A well region 5 is formed in the drift region 2 and has inverse conductivity type compared to the drift region 2. A highly doped source region 6 is provided in the well region 5 and thus forms a pn-junction with the well region 5. A region 9 at a surface of the drift region 2 and positioned within the well region 5, laterally adjacent to the source region 6 is referred to as "channel region", since here a conductive path is forming when an appropriate control voltage is applied to a gate electrode structure 4a, which comprises a gate electrode 4, for instance a doped polysilicon material, and a gate dielectric layer 3, such as a silicon dioxide material, that separates the gate electrode 4 from the channel region 9 and the drift region 2. Furthermore, the transistor 10 comprises an interlayer or intermetal dielectric material 7, which includes openings (not shown) for contacting the gate electrode 4 and for connecting the source region 6 and the well region 5, as indicated by reference sign 8.

The transistor as illustrated in FIG. 1 is typically formed by providing the substrate 1 having the desired dopant concentration, while the drift region 2 receives the reduced dopant concentration, for instance by epitaxially forming a semiconductor material and concurrently incorporating the dopant species therein. The gate structure 4a is provided on the basis of well established deposition and/or oxidation techniques. Thereafter, the well region 5 is formed by an implantation and anneal process. That is, the dopant species of the well region 5 is implanted in the presence of the gate electrode structure 4a, which acts as an implantation mask, thereby achieving a self-aligned position of the well region 5 relative to the gate electrode 4. During the subsequent anneal process a diffusion of the dopants is initiated, wherein the process parameters (temperature and process time) are selected such that the desired lateral "overlap" of the well region 5 with the gate electrode 4 is achieved. It should be appreciated that a vertical diffusion also takes place. Similarly, the dopant species of the source region 6 is implanted in self-aligned manner by using the gate electrode structure 4a and any resist mask as an implantation mask. In a further anneal process the final shape of the source region 6, and possibly of the well region 5, is/are adjusted by initiating a desired degree of diffusion. Finally, the interlayer dielectric material 7 is deposited and the openings are formed therein so as to connect to the contact area 8.

During operation of the transistor 10—for an assumed n-channel transistor—a zero or negative gate-source or gate-well voltage results in a substantially non-conductive state of the channel region 9, except for low leakage currents. Upon applying a positive gate-source voltage increasingly electrons collect at the interface formed by the well region 5 and the gate dielectric layer 3. The electrons recombine with the majority charge carriers (the holes) until the gate-source voltage exceeds a threshold voltage, which represents the voltage level at which excess electrons remain, thereby "inverting" the channel region 9 and forming a conductive channel between the source region 6 and the drift region 2 through the well region 5. It should be appreciated that the transistor's characteristics, such as on-resistance, threshold voltage, and the like are strongly related to the configuration of the dopant profiles of the regions 2, 5, 6.

In order to obtain a depletion mode operation based on the configuration of the transistor 10 as described above, U.S. Pat. No. 4,003,071 (Sadaaki Takagi, Fujitsu) proposes to apply an additional implantation so as to incorporate dopants near the surface of the channel region 9 in order to increase the doping therein such that a conductive path is obtained. Hence, a conductive connection between the source region 6 and the drift region 2 is obtained via the additionally introduced dopants. In the above described example of an n-channel transistor, an n-type dopant species is incorporated into the channel region 9, such as phosphorous, arsenic or antimony at a moderately low implantation dose. In this manner the highly doped drain 1 and source regions 6 are electrically connected in the absence of a gate voltage. On the other hand the conductive channel can be depleted by applying a negative gate voltage, thereby switching off the transistor 10.

U.S. Pat. No. 6,700,160 (Steven Merchant, Texas Instruments) discloses a DMOS transistor having an additional doped region below the gate oxide within the lightly doped drift region 2 and within a portion of the well region 5. However, the operating mode (enhancement type or depletion type) is not changed by this change in configuration.

Generally, providing an additional doped region in the channel region of an enhancement type transistor so as to achieve a depletion mode is a promising approach. However, implanting the additional dopants through the gate electrode or even through the gate dielectric material may result in significant damage of the gate dielectric material, thereby deteriorating the overall transistor performance. On the other hand, incorporating the additional dopants prior to forming the gate dielectric material will cause a pronounced dopant diffusion during the anneal process for aligning the well profile. In particular, a pronounced vertical diffusion into the well region 5 will occur, thereby negatively affecting the overall transistor behaviour. By using appropriate dopant species having a high diffusion coefficient, such as boron, for the well region and having a low diffusion coefficient for the additional channel doping, such as arsenic or antimony, the vertical diffusion into the depth of the well region may be reduced, but cannot be avoided.

When switching off the transistor, however, an early breakdown may occur, since the effective well doping is reduced due to the additional channel doping even if strongly negatively biased. Hence, the space charge region in the well region may extend or punch through to the highly doped source region 6.

FIG. 2 schematically illustrates the results of a simulation in a conventional depletion mode transistor that comprises an additionally doped channel region, wherein the additional dopant species is schematically denoted by reference sign 21. The channel region comprising the additional doping 21 has the inverse doping of the well region 5, as explained above. Here, the status of a negative gate voltage (the off-mode) is illustrated. As indicated by the potential lines even a moderately low voltage between the drain and source may lead to a punch through of the drain potential to the source region 6. A non-desired reduction of the punch through voltage caused by the doping situation for forming the additionally-doped channel region may be compensated by increasing the channel length (for FIG. 1 the horizontal extension of the channel region 9). As evaluated above, the overall dopant profile and thus the channel length is typically adjusted by means of the temperature and the duration of the anneal processes. For example, an increased channel length is obtained by increasing the diffusion activity during the well diffusion, thereby, however, not only increasing the lateral diffusion and thus the channel length, but also increasing the vertical extension of the well region, which may result in a non-desired change of the transistor's characteristics.

SUMMARY OF INVENTION

It is an object of the invention to provide a depletion type DMOS transistor having an increased breakdown voltage based on an increased channel length while avoiding one or more of the problems described above.

The invention provides a DMOS transistor and manufacturing techniques for forming the same, wherein a depletion mode is achieved by providing an additional implantation into the channel region of the DMOS transistor, thereby forming a doped region that is also referred to as an "additionally-doped channel region".

Due to the additionally doped channel region a conductive path is established without applying a gate voltage. The implantation of the additional channel doping is preferably performed prior to forming the gate dielectric material, thereby avoiding any implantation induced damage in the gate dielectric material. For the subsequent implantation of the well region the gate electrode is used as an implantation mask, which has an appropriate structure so as to enable the incorporation of the well dopant species in the semiconductor material laterally adjacent to the gate electrode and also locally below the gate electrode structure, thereby enabling an increased lateral diffusion of the well dopant species without increasing the vertical diffusion. Hence, a desired increase in channel length may be obtained on the basis of the increased lateral diffusion caused by the well dopant species that is additionally provided locally below the gate electrode structure. The increased channel length in turn may compensate for the additionally doped channel region in terms of punch through voltage, while not unduly increasing a depth of the well region.

In one aspect of the invention a depletion type DMOS transistor is suggested (claims 1 and 22). The transistor comprises a gate electrode structure formed on a semiconductor material and comprising a gate dielectric layer and an electrode. The electrode comprises a first electrode portion and a second electrode portion that are laterally separated (along a current flow direction) by an insulating material. Moreover, a source region of a first conductivity type is formed in the semiconductor material laterally adjacent to and partially below the first electrode portion. The transistor further comprises an additionally doped channel region of the first conductivity type connecting to the source region and extending below the first and second electrode portions along the current flow direction. A well region of a second conductivity type is formed in the semiconductor material so as to be in contact with the source region, the additionally doped channel region and a drift region of the first conductivity type, wherein the well region laterally extends below the first and second electrode portions along the current flow direction. Additionally, the transistor comprises a drain region of the first conductivity type that is in contact with the drift region.

As explained above, the transistor of this aspect comprises a "gapped" gate electrode structure, which allows an intermediate incorporation of the well dopant species, thereby providing an extra length for the channel without contributing to an increased "vertical" extension of the well region.

The transistor may further comprise a coupling portion so as to electrically connect the first and second electrode portions. Hence, the gate electrode may act as an electrically single entity, while nevertheless providing for the superior well dopant distribution during the implantation of the well dopant species.

In a further embodiment the coupling portion is a part of the electrode. In this case the coupling portion and the electrode portions may be formed together from the electrode material, thereby avoiding additional process steps.

In a further embodiment the coupling portion comprises a metal region formed in a device level above the gate electrode structure. Hence, materials of superior conductivity may be used, while at the same time the ion blocking effect of any coupling portions may be avoided, which may thus allow to apply a reduced implantation dose.

The well region may be formed below the coupling portion so as to provide a continuous well region. Hence, any adverse effect of the coupling portion on the final well dopant distribution may be avoided.

In a further embodiment the electrode comprises a central opening formed above a portion of the source region. This configuration of a transistor cell enables a spatially effective layout, wherein the gapped configuration of the electrode provides for the desired increased lateral under-diffusion of the well region. For example, the central opening has a square, a circular, a rectangular, a hexagonal or an octagonal shape in a top view.

According to a further aspect of the disclosure a semiconductor device including a depletion mode DMOS transistor is suggested and claimed (claim 9). The semiconductor device comprises a gate electrode structure formed on a semiconductor material and comprising a gate dielectric material and an electrode comprising a gap. The device further comprises a source region formed in the semiconductor material and extending partially below the electrode. Moreover, a channel region is formed in the semiconductor material and extends below the electrode and the gap from the source region to a drift region. Additionally, the transistor comprises a drain region connecting to the drift region.

Hence, the semiconductor device provides a laterally increased (or extended) channel length, as explained above.

In further embodiments the channel region comprises an additional channel doping having the same conductivity type as said source region.

The electrode may comprise at least a first electrode portion and a second electrode portion that are laterally separated along a current flow direction by the gap. The electrode may comprise a material portion so as to electrically connect the first and second electrode portion.

In other embodiments the first and second electrode portions are electrically connected by an interconnect structure that is at least partially formed in a metallization system of the semiconductor device.

In a further embodiment the gate electrode structure comprises a central opening and a current flow direction in the channel region is oriented outwardly from the central opening.

In yet another embodiment the central opening has one of a square shape, a circular shape, a rectangular shape, a hexagonal shape and an octagonal shape according to a top view of the gate electrode structure.

According to another aspect of the invention a method of forming a depletion mode DMOS transistor in a semiconductor device is provided (claim 20). The method comprises the steps of introducing an additional channel dopant species into a semiconductor layer and forming a gate electrode structure above the semiconductor layer, wherein the gate electrode structure comprises a gate dielectric material and a gate electrode including a gap. The method further comprises steps of implanting a well dopant species into the semiconductor layer laterally adjacent to the gate electrode structure and through the gap and performing a first anneal process so as to form a continuous well region. The method further comprises forming a mask above the gap and implanting a source dopant species into the semiconductor layer by using the mask and the gate electrode structure as an implantation mask. The method further comprises the steps of performing a second anneal process so as to diffuse a portion of the source dopant species below the gate electrode structure.

Based on the method above, the lateral extension of the well region may be increased without contributing to an increased vertical extension of the well region, since the gap enables a local incorporation of a portion of the well dopant species, which may thus connect during the subsequent anneal process to the well dopant species implanted at the periphery of the gate electrode. On the other hand, during the implantation of the source dopant species the mask ensures a continuous ion blocking effect of the gate electrode similarly to conventional approaches, as previously described.

In a further embodiment the forming of the gate electrode structure comprises: depositing an electrode material on the gate dielectric material and patterning the electrode material so as to obtain the gap and at least one coupling portion that electrically connects portions of the gate electrode separated by the gap. In this manner the electrode still functions as an electrical unit, without requiring additional process steps.

In a further embodiment the forming of the gate electrode structure comprises: depositing an electrode material on the gate dielectric material and patterning the electrode material so as to obtain a first portion and a second portion electrically insulated from each other by the gap. In this case, superior uniformity of the well dopant distribution after the implantation may be achieved, wherein the electrical connection of the separated first and second portions may be accomplished by forming an interconnect structure in a wiring system of the semiconductor device In yet another aspect of the present invention a method of forming a DMOS transistor comprises: implanting a well dopant species into a semiconductor material in the presence of a gate electrode structure having at least one gap for incorporating a portion of the well dopant species into the semiconductor material through the at least one gap. The method further comprises: masking the at least one gap and implanting a source dopant species into the semiconductor material in the presence of the gate electrode structure including the at least one masked gap. Additionally, the method comprises: forming a well region and a source region by performing anneal processes so as to initiate diffusion of the well dopant species and the source dopant species.

Hence, the well dopant species may laterally be diffused due to the positioning of a portion of the well dopant species at the at least one gap, which then is masked during the incorporation of the source dopant species.

In a further embodiment an additional channel dopant species is incorporated prior to forming the gate electrode structure. In this manner a depletion mode channel region may be provided without unduly affecting the sensitive gate dielectric material.

Reference signs in the claims are for quicker reference, not for reading the embodiments into the claim language.

BRIEF DESCRIPTION OF THE DRAWINGS

The embodiments support the understanding of the invention(s) as claimed. They are not "the invention", but examples (embodiments) thereof.

DETAILED DESCRIPTION OF THE INVENTION

With reference to the drawings further illustrative embodiments will now be described, wherein identical or similar components may be denoted by the same reference signs.

Figure 1:
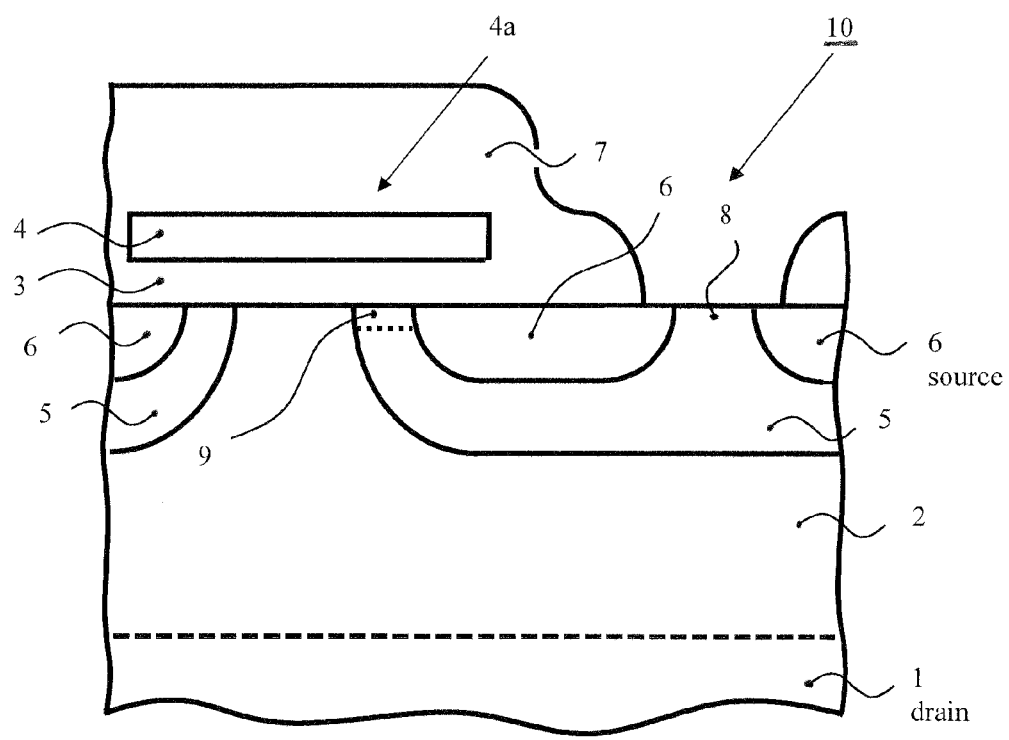
FIG. 1 schematically illustrates a cross-sectional view of a vertical DMOS transistor as an enhancement mode type according to conventional transistor architecture, FIG. 2 schematically illustrates a (voltage) potential in off state in a known transistor having an additionally doped channel region to obtain a depletion type DMOS transistor, thereby reducing punch through voltage, FIG. 3 schematically illustrates a cross-sectional view of a new DMOS transistor of the depletion type including an increased channel length, while the well region has a desired vertical extension, FIG. 4 schematically illustrates the (off state voltage) potential in the transistor having an additional channel region and a gapped gate electrode, wherein early punch through may be avoided, FIG. 5 schematically illustrates a perspective view of a DMOS transistor including gaps in the gate electrode, FIG. 6 schematically illustrates a top view of a gate electrode structure comprising gaps and coupling portions for electrically connecting separated electrode portions, FIG. 7 schematically illustrates a top view of a DMOS transistor cell having a central gate opening and FIG. 8 schematically illustrates a perspective view of a DMOS transistor including a gate electrode having separated electrode portions that are electrically connected by an interconnect structure formed at least partially in the metallization system of the device.
Figure 2:
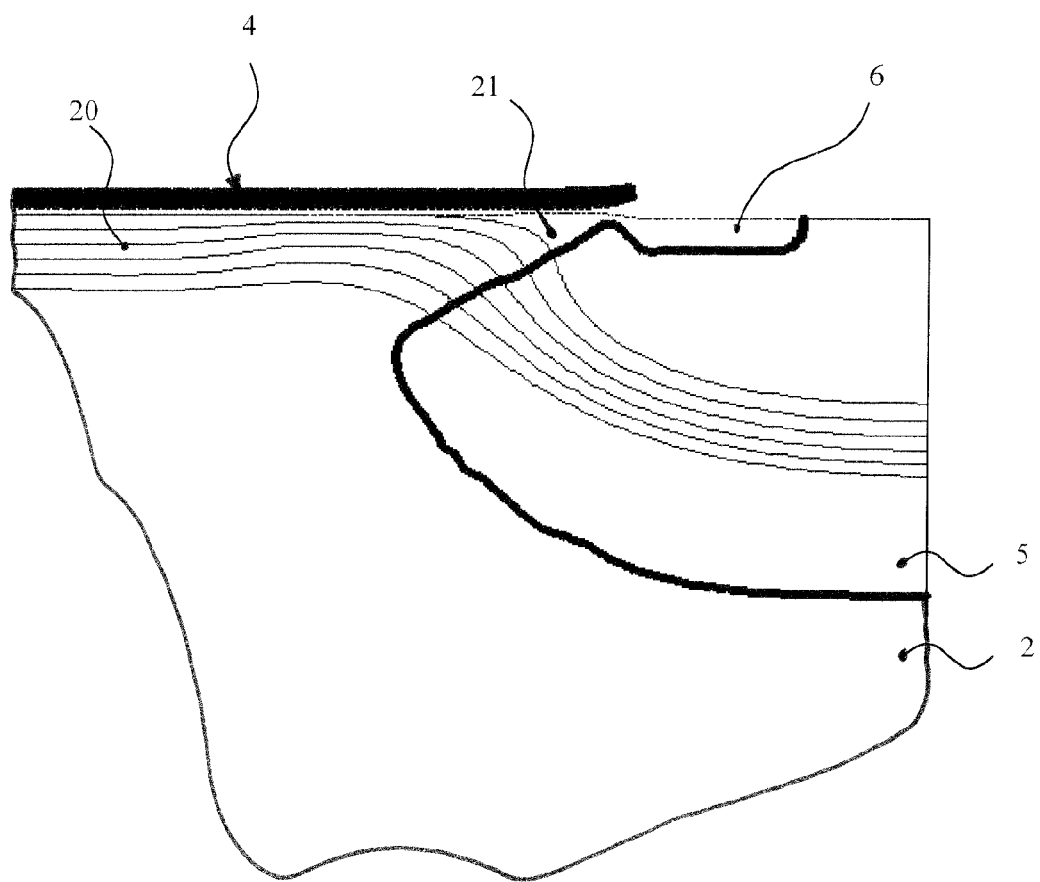
Figure 3:
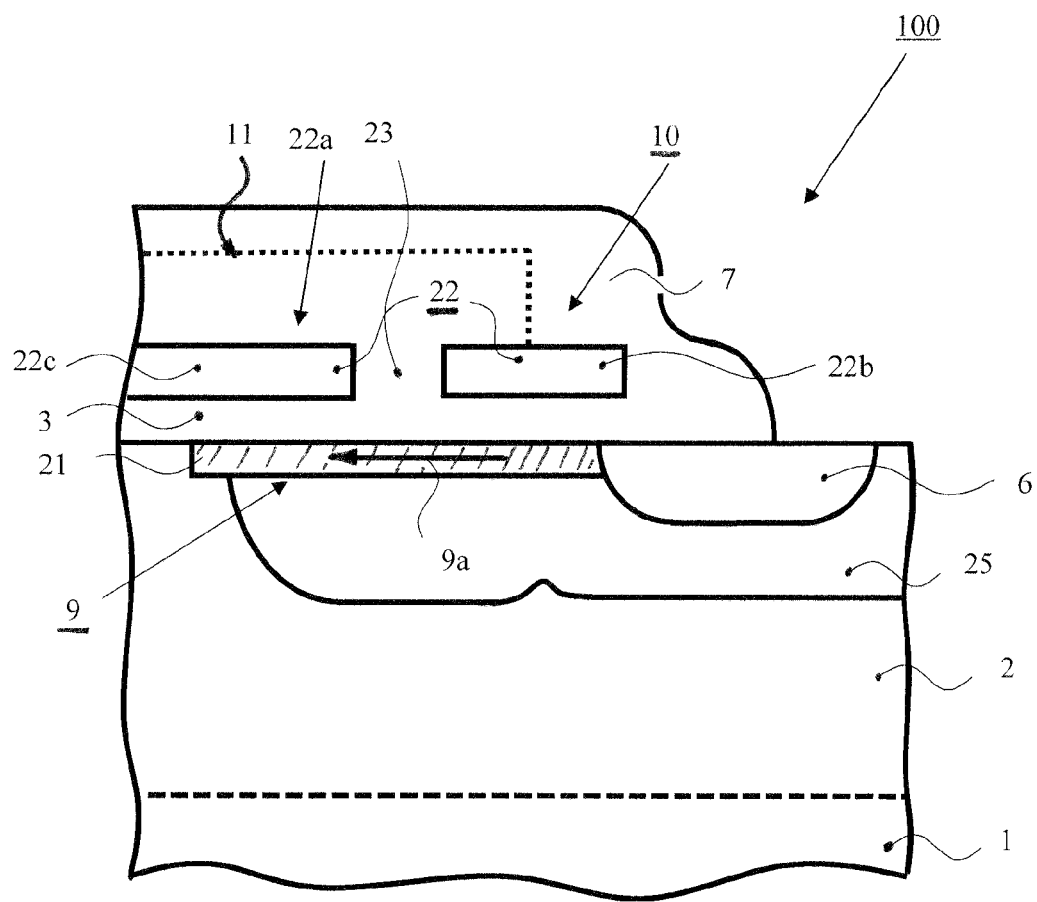

FIG. 3 schematically illustrates a cross-sectional view of a semiconductor device 100 including a DMOS transistor 10 in the form of a depletion type transistor. The transistor comprises a semiconductor material including a highly doped drain region 1, a lightly doped semiconductor layer or drift region 2, which may have a similar configuration as described above with reference to FIG. 1. Hence, for an n-channel transistor the regions 1 and 2 are n-doped regions. Moreover, a well region 25 of increased lateral extension is formed in the semiconductor material of the device 100 and comprises a channel region 9 that connects to a source region 6. Due to the increased lateral extension of the well region 25 also the length of the channel region 9 is increased as required for forming a conductive path between the source region 6 and the drift region 2 without applying a voltage across a gate electrode structure 22a and the source region 6, as is also previously explained.

The gate electrode structure 22a comprises a gate dielectric material 3 that separates a gate electrode 22 from the channel region 9, including the additional channel doping, which is schematically indicated by reference 21, and the source region 6. The gate electrode 22 may comprise two or more electrode portions 22b, 22c that are separated along a current flow direction 9a, thereby forming a gap or slit 23. The gap 23 is filled by an insulating material of an interlayer dielectric material 7. As shown, the additionally doped 21 channel region 9 and the well region 25, extend continuously along the direction 9a, thereby also "bridging" a portion in the semiconductor material that is positioned below the gap 23.

The device 100 including the transistor 10 is formed on the basis of the following processes. First, the highly doped drain region 1 is formed, for instance by providing a highly doped substrate or by incorporating a desired high dopant concentration. Next, the semiconductor layer 2 is formed so as to have the desired low dopant concentration as required for a drift region. For this purpose, a semiconductor material may be epitaxially grown on the material 1, thereby incorporating the desired amount of dopants. Thereafter, any isolation structures or field oxide regions (not shown) are formed, followed by the implantation of a dopant species for incorporating the additional channel dopant species 21. The additional channel dopant species may laterally be restricted by providing an implantation mask, such as a resist mask, and the like. The gate dielectric material 3 is then formed for instance by oxidizing a portion of the layer 2, thereby forming a silicon dioxide material when the layer 2 is comprised of silicon. It should be appreciated that the gate dielectric material 3 may also be formed, additionally or alternatively, by depositing a dielectric material. Thereafter, the material of the gate electrode 22 is deposited, for instance as a metal, doped polysilicon, non-doped polysilicon, and the like. The electrode material is then patterned by forming an etch mask and performing appropriate and well-established etch processes. The patterning of the electrode material is, however contrary to conventional approaches, based on a design that includes the one or more gaps 23, thereby providing at least the first and second electrode portions 22b, 22c. During the patterning the gate dielectric material 3 may be used as an etch stop material. The "length" of the gap 23, i.e., the lateral extension thereof along the direction 9a, and the length of the electrode portion 22b are selected in accordance with the diffusion behaviour of the well dopant species in the well region 25 that is implanted into the layer 2 by using the gate electrode structure 22a as an implantation mask. Hence, during the well implantation a well dopant species is also introduced into the layer 2 through the gap 23, thereby forming locally intermediate dopant reservoirs that act as dopant sources during the subsequent anneal process in order to diffuse the well dopant species laterally below the electrode portion 22b starting from the gap 23 and from the periphery of the gate electrode 22 at the right hand side of FIG. 3. As discussed above, also the depth of the well region 25 is determined during the anneal process and possibly during a further anneal process, which is however decoupled from the total lateral extension of the well region below the gate electrode 22 due to the presence of the additional well dopant source provided below the gap 23. Since the diffusion behaviour may be determined in advance for given dopant species and anneal parameters, the lateral size of the gap 23 and the electrode portion 22b may be appropriately be selected so as to obtain the continuous region 25 having the desired lateral extension.

Next, a mask 11, such as a resist mask, is formed so as to cover the gap 23, which is accomplished by performing a lithography process using an appropriate lithography mask. It should be appreciated that the alignment of the mask 11 is not critical as long as the gap 23 is reliably covered while the periphery of the gate electrode 22 remains exposed in order to achieve the self aligning effect when performing a further implantation process for incorporating the source dopant species of the source region 6. Thus, during the source implantation the gate electrode 22 provides for desired masking effect due to the presence of the additional mask 11. If desired, the mask 11 may also be used to remove an exposed portion of the gate dielectric material 3, while maintaining the dielectric material 3 within the gap 23. After removing the mask 11 the source dopant species is diffused in a desired manner by applying a further anneal process, in which also an additional diffusion of the well dopant species may occur. Thereafter, the interlayer dielectric material 7 is deposited and patterned to form openings therein, which may be filled with an appropriate conductive material. Next, a metallization system (not shown) is formed in accordance with the overall device requirements.

Figure 4:
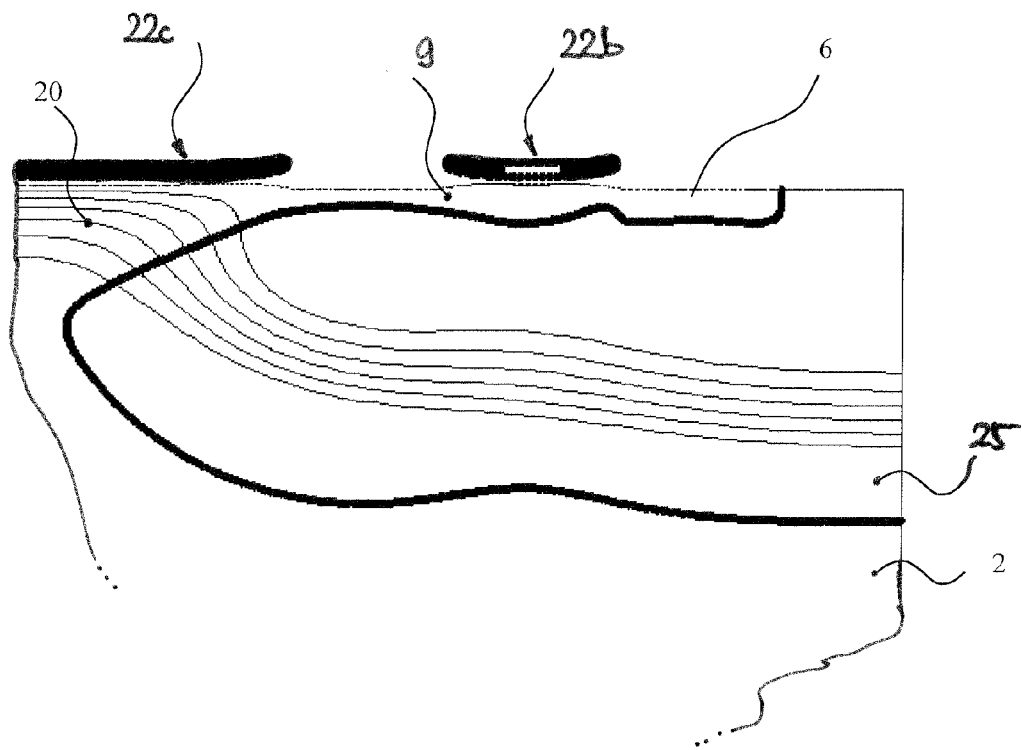

FIG. 4 schematically illustrates the results of a simulation of the transistor 10 of FIG. 3 when operated in the off-state. Due to the appropriate depth of the well region 25 and the extended length of channel 9 provided therein, the negatively biased state of the gate electrode 22 may result in a high breakdown voltage, thus avoiding an early punch through, as indicated by the potential lines 20.

Figure 5:
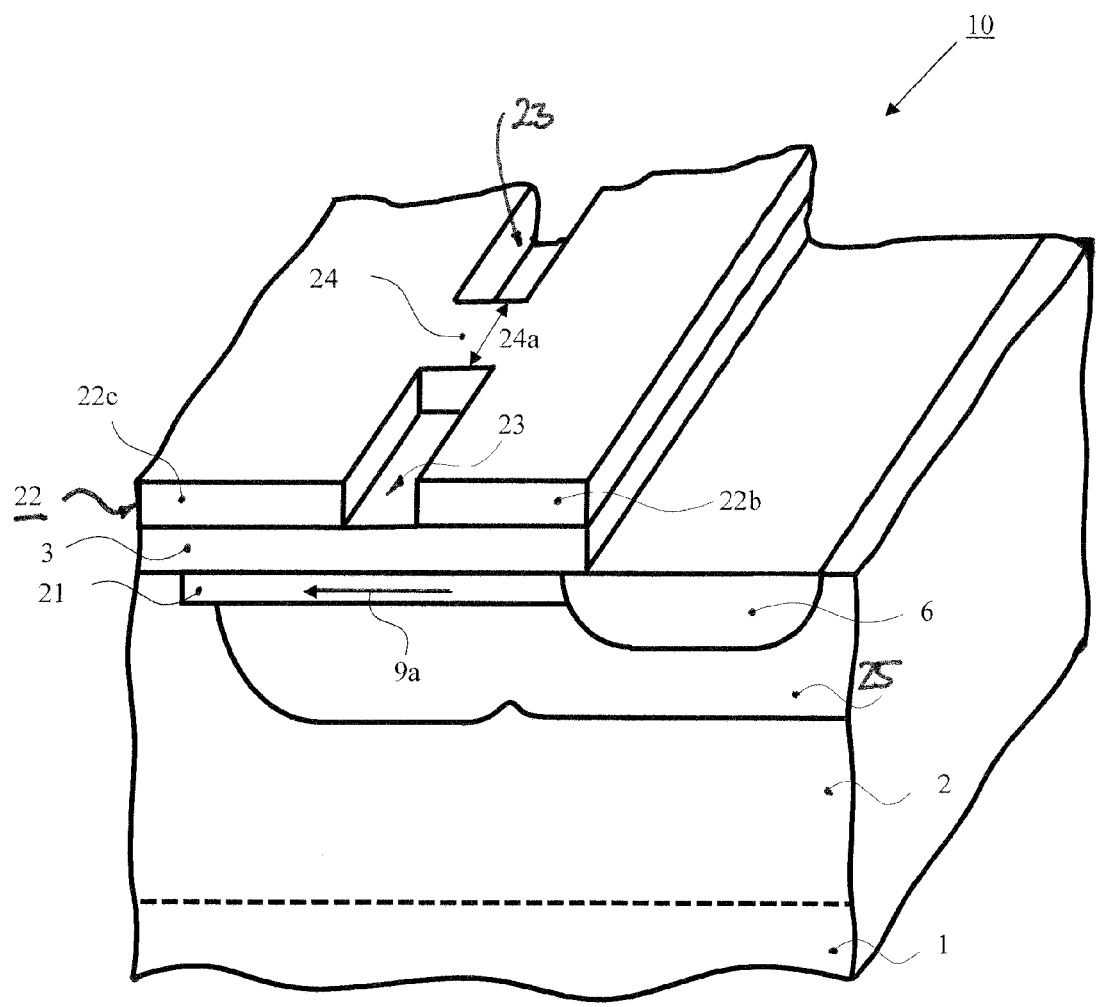

FIG. 5 schematically illustrates a perspective view of the transistor 10 according to one illustrative embodiment. As shown, the gap 23 is "interrupted" by a coupling portion or a coupling fin 24, which thus electrically connects the electrode portions 22b and 22c. Hence, the gate electrode 22 may be considered electrically as a single component, while in view of the ion blocking effect, nevertheless the desired dopant sources for the well dopant species are obtained, as discussed above. In order to not unduly disconnect the well region 25 in the vicinity of the coupling portion 24, the lateral dimension, such as a width 24a, is selected such that for the given dopant diffusivity of the well dopant species and the given anneal parameters the well region may also extend below the portion 24 and continuously connect to the remaining areas of the well region 25.

Figure 6:
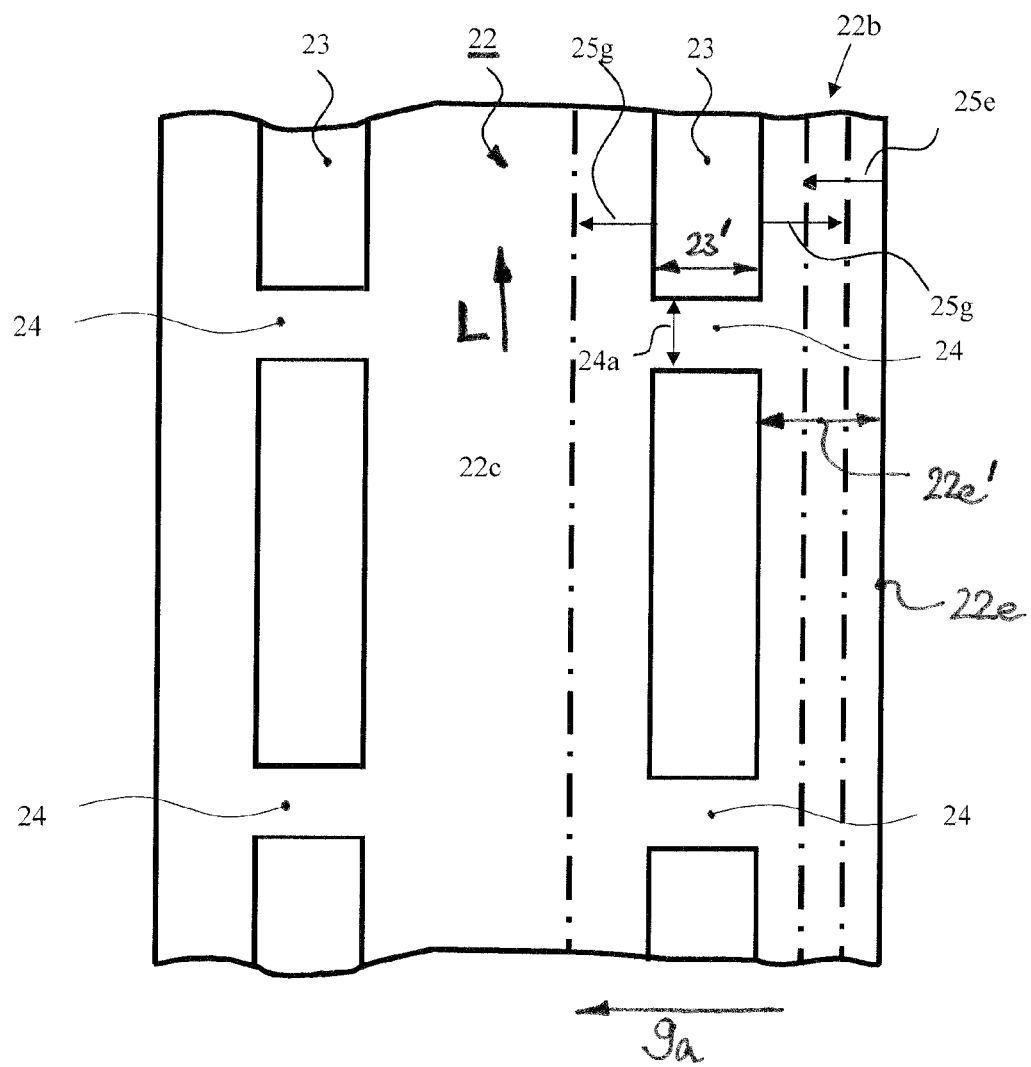

FIG. 6 schematically shows a top view of the gate electrode 22 with the gap 23 discontinued along the lateral direction L by the coupling portions 24. For convenience, the following description refers to the transistor cell shown at the right hand side of FIG. 6 only. The lateral dimensions of the electrode portion 22b and the lateral position of the gap 23 are selected such that the well region 25 is obtained in a continuous configuration. As shown, the diffusion of the well dopant species may result in lateral extension 25e, when the well dopant species is initially positioned at the periphery or edge 22e of the portion 22b after implantation. On the other hand, the diffusion from the gap 23 towards the edge 25e may result in an extension 25g, wherein the combined length of the extensions 25e and 25g is greater than the distance from the gap 23 to the edge 22e. Similarly, the dimension of the coupling portion 24, indicated as 24a, which may also be understood as the distance of individual gap portions, is less than twice the extension 25g.

When the above conditions with respect to the diffusion of the well dopant species are fulfilled, the extension of the well region 25 below the portion 22 or under portion 22c is determined by: The extension 25g, a 'width' 23' of the gap 23 (in the current flow direction 9a) and an offset 22e' of the gap 23 from the edge 22e. The extension 25g, width 23' and offset 22e' sum up to a "total length below gate 22".

It should be noted that due to the nature of a diffusion process the corresponding lateral dimensions, such as 25g, 25e, are to be understood as indications describing a threshold value of the dopant concentration. For example, a "boundary" of a diffusion region may be understood as location at which the concentration drops to less than 30% of a maximum concentration.

Figure 7:
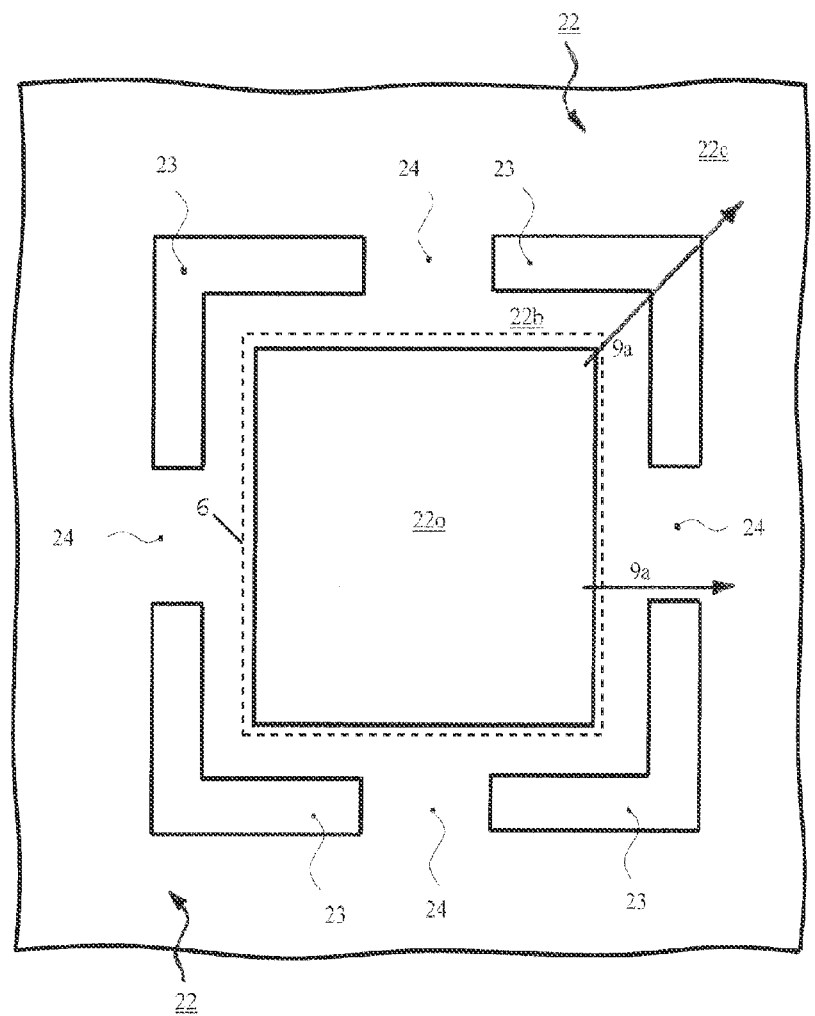

FIG. 7 schematically shows a top view of the gate electrode 22 for a transistor cell configuration, in which the gate electrode comprises a central opening 22o formed above a portion of the source region (not shown). Hence, the current flow direction is oriented outwardly away from the central opening 22o. The source region may thus overlap with the first electrode portion 22b, which delineates the central opening 22o. Moreover, a plurality of gaps (or gap portions) 23 separate the portion 22b from the portion 22c along the current flow direction 9a. In this example, the lateral dimensions of the portion 22b, the gaps (gap portions) 23 and the coupling portions 24 are selected in accordance with the considerations given above with respect to FIG. 6 in order to obtain a continuous well region. In other embodiments, the shape of the gate electrode 22 may differ from the square shape of FIG. 7. For example, a rectangular shape, a hexagonal shape or an octagonal shape may be provided for the central opening, thereby obtaining a spatially efficient configuration for a transistor cell.

Figure 8:
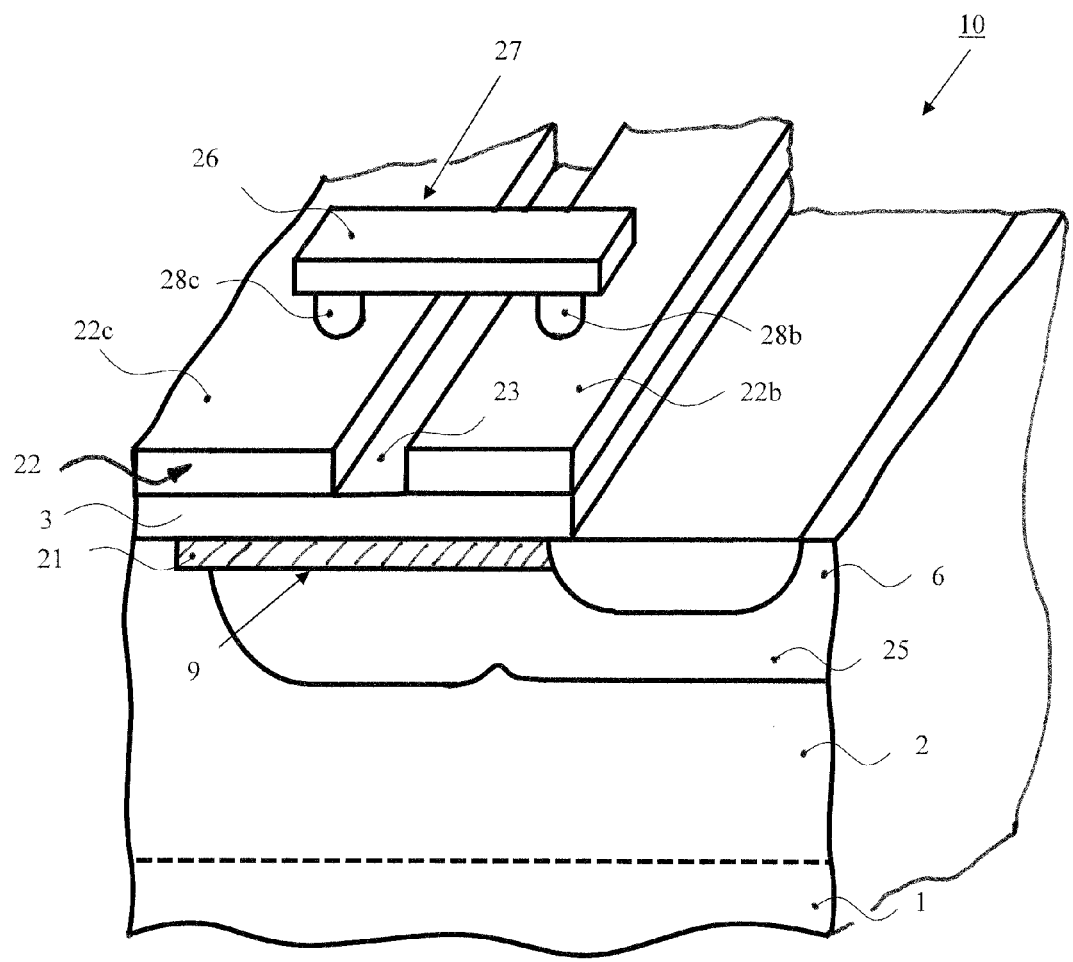

FIG. 8 schematically illustrates a perspective view of the transistor 10 according to further embodiments, in which the gate electrode 22 comprises the electrode portions 22c, 22b as isolated portions. In this case the gap 23 may not be interrupted by any coupling portions provided in the gate electrode material itself. Instead the electrical connection is established by an interconnect structure 27, at least a portion of which is formed in a metallization system of the semiconductor device that includes the transistor 10. For example, the interconnect structure 27 comprises a first contact element 28b formed in the interlayer dielectric material (not shown) and connecting to the electrode portion 22b. Furthermore, a second contact element 28c is provided and connects to the electrode portion 22c. The first and second contact elements may be formed during the standard contact process. Thereafter, a first metallization level is formed, in which a metal region 26 is provided so as to connect the first and second contact elements 28b, 28c. Thus, during the implantation of the well dopant species on the basis of the non-interrupted gap 23, a superior dopant distribution may be achieved, while the interconnect structure may provide for a highly conductive connection without requiring any additionally process steps.

It should be appreciated that the transistors described herein may be provided as p-channel transistors and n-channel transistors by appropriately selecting the type of dopants used for the various semiconductor regions. Thus, n-channel depletion type transistors and/or p-channel depletion type transistors may be provided in the semiconductor device depending on the overall circuit configuration. Furthermore, if a further increased channel length is required, two or more gaps may sequentially be provided along the current flow direction, wherein the spacing of the gaps is appropriately selected so as to obtain a continuous well region of increased lateral extension. Moreover, the semiconductor devices described herein may preferably be fabricated on the basis of silicon as the base material. However, in other cases the principles disclosed herein may also be applied to other semiconductor materials, such as germanium, silicon/germanium, any compound semiconductors, and the like.

Moreover, in the embodiments described with reference to the drawings, vertical DMOS devices are referred to. In other embodiments, the drain and source configuration may be provided in a lateral or planar configuration so as to provide a lateral DMOS device.

We claim as our invention:

1. A depletion mode DMOS transistor comprising:
   a gate electrode structure (22a) formed on a semiconductor material (2, 1) and comprising a gate dielectric layer (3) and an electrode (22), the electrode comprising a first electrode portion (22b) and a second electrode portion (22c) laterally separated by an insulating material (7);
   a source region (6) of a first conductivity type formed in the semiconductor material (2) partially below the first electrode portion (22b);

an additionally doped channel region (9,21) of the first conductivity type connecting to the source region (6) and extending below the first and second electrode portions (22b, 22c) along a current flow direction (9a), the additionally doped channel region (9,21) vertically overlapping with the first and second electrode portions (22b, 22c);

a well region (25) of a second conductivity type formed in the semiconductor material (2) so as to be in contact with the source region (6);

the additionally doped channel region (9,21) establishing a conductive path in the absence of a gate voltage from said source region to a drift region (2) being of the first conductivity type;

the well region (25) extending laterally below the first and second electrode portions (22b, 22c); and a drain region (1) of the first conductivity type provided in contact with the drift region (2).

2. The DMOS transistor of claim 1, further comprising a coupling portion (24) so as to electrically connect said first and second electrode portions (22b, 22c).

3. The DMOS transistor of claim 2, wherein said coupling portion (24) is a part of said electrode (22).

4. The DMOS transistor of claim 2, wherein said coupling portion comprises a metal region (26) formed in a device level above said gate electrode structure.

5. The DMOS transistor of claim 3, wherein said well region is formed below said coupling portion so as to provide a continuous well region.

6. The DMOS transistor of claim 1, wherein said electrode comprises a central opening (22o) formed above a portion of said source region.

7. The DMOS transistor of claim 6, wherein said central opening has a square shape in a top view.

8. The DMOS transistor of claim 6, wherein said central opening has one of a circular, rectangular, hexagonal and an octagonal shape.

9. A semiconductor device including a depletion mode DMOS transistor, the semiconductor device comprising:
a gate electrode structure on a semiconductor material and comprising a gate dielectric material and an electrode, said electrode comprising a gap between first and second electrode portions of the electrode;
a source region of a first conductivity type in said semiconductor material and extending partially below said gate electrode structure;
a channel region comprising an additional channel region of said first conductivity type in said semiconductor material and extending below said gate electrode structure and said gap from said source region to a drift region of said first conductivity type, said additional channel region vertically overlapping with said gap; and
a drain region connecting to said drift region.

10. The semiconductor device of claim 9, wherein said electrode first electrode portion and said second electrode portion are laterally separated along a current flow direction by said gap.

11. The semiconductor device of claim 10, wherein said electrode comprises a material portion so as to electrically connect said first and second electrode portions.

12. The semiconductor device of claim 10, wherein said first and second electrode portions are electrically connected by an interconnect structure that is at least partially formed in a metallization system of said semiconductor device.

13. The semiconductor device of claim 9, wherein said gate electrode structure comprises a central opening and a current flow direction in said channel region is oriented outwardly from said central opening.

14. The semiconductor device of claim 13, wherein said central opening has one of a square shape, a circular shape, a rectangular shape, a hexagonal shape and an octagonal shape in a top view of said gate electrode structure.

15. A depletion mode DMOS transistor comprising:
a gate electrode structure formed on a semiconductor material and comprising a gate dielectric layer and an electrode, the electrode comprising a first electrode portion and a second electrode portion laterally separated by an insulating material;
a source region of a first conductivity type formed in the semiconductor material partially below the first electrode portion;
an additionally doped channel region of the first conductivity type connecting to the source region and extending below the first and second electrode portions along a current flow direction, the additionally doped channel region laterally overlapping the first and second electrode portions;
a well region of a second conductivity type formed in the semiconductor material so as to be in contact with the source region;
the additional channel region forming a conductive path in the absence of a gate voltage with a drift region being of the first conductivity type;
the well region extending laterally below the first and second electrode portions; and
a drain region of the first conductivity type provided in contact with the drift region.

* * * * *

UNITED STATES PATENT AND TRADEMARK OFFICE
CERTIFICATE OF CORRECTION

| | | |
|---|---|---|
| PATENT NO. | : 9,070,768 B2 | Page 1 of 1 |
| APPLICATION NO. | : 13/579155 | |
| DATED | : June 30, 2015 | |
| INVENTOR(S) | : Ralf Lerner et al. | |

It is certified that error appears in the above-identified patent and that said Letters Patent is hereby corrected as shown below:

In the Claims:

Col. 12, lines 5-6, "said electrode first electrode portion" should read --said first electrode portion--

Signed and Sealed this
Thirteenth Day of October, 2015

Michelle K. Lee
*Director of the United States Patent and Trademark Office*